United States Patent [19]
Wittkower et al.

[11] 3,954,191
[45] May 4, 1976

[54] ISOLATION LOCK FOR WORKPIECES

[75] Inventors: Andrew B. Wittkower, Rockport; Geoffrey Ryding, Manchester, both of Mass.

[73] Assignee: Extrion Corporation, Gloucester, Mass.

[22] Filed: Nov. 18, 1974

[21] Appl. No.: 524,354

[52] U.S. Cl. ............................................. 214/17 B
[51] Int. Cl.² ........................................ C23C 13/08
[58] Field of Search .................... 214/17 B; 34/242; 118/49.1

[56] References Cited
UNITED STATES PATENTS

| | | | |
|---|---|---|---|
| 2,317,276 | 4/1943 | Knight | 214/17 B |
| 3,260,383 | 7/1966 | Fitzgerald | 214/17 B |
| 3,901,183 | 8/1975 | Wittkower | 214/17 B X |

*Primary Examiner*—Robert G. Sheridan

[57] ABSTRACT

An isolation lock through which a workpiece item can move in a path between first and second regions at different pressures, the lock comprising a housing having an upper item entrance and a lower item exit at opposite sides of the housing, a movable member within the housing defining an item-receiving surface disposed substantially in a plane which lies at a constant acute angle to the horizontal regardless of its position to enable gravity movement of the workpiece over the surface, the member movable to translate the item-receiving surface between upper and lower positions in which, respectively, the uppermost portion of the surface is adjacent the entrance to receive the workpiece and the lowermost portion of the surface is adjacent the exit to deliver the workpiece and means providing an air-tight seal between the exit and the surface when the surface is in its upper position and between the entrance and the surface when the surface is in its lower position. The movable member is shown as a piston movable in reciprocating linear motion, the item-receiving surface comprising an end surface of the piston, and an internal flange is provided intermediate the entrance and exit, this flange disposed to engage the piston when the piston is in its upper position, a resilient seal member being disposed between the flange and the piston to provide the air-tight seal between the exit and the surface.

10 Claims, 4 Drawing Figures

ISOLATION LOCK FOR WORKPIECES

BACKGROUND OF THE INVENTION

This invention relates to isolation locks such as are employed to transfer workpieces between first and second isolated volumes (e.g., the transfer of workpieces from the ambient atmosphere to a vacuum chamber and back again).

In certain manufacturing operations it is necessary to transfer wafer-form items between two isolated volumes individually, but at a relatively rapid rate. An example of this is the process of implanting ions in a semi-conductor wafer, the implantation occurring in a vacuum chamber. In order to achieve a rapid rate of production, the individual wafers should be transferred from the ambient into the vacuum, and then from the vacuum back out to the ambient with a time-of-transfer per wafer which is no greater than the required exposure time of the wafer to the ion beam. Additionally, it is desirable that the transfer be accomplished in a substantially automatic manner, thereby reducing labor requirements, while simultaneously providing for the gentle handling of the typically delicate wafers.

In view of the foregoing, it is a principal object of the present invention to provide an isolation lock which achieves the above goals.

SUMMARY OF THE INVENTION

To achieve these and other objects as shall further appear, the present invention provides an isolation lock through which a wafer-form item moves in a path between first and second isolated volumes which are separated by a wall having an opening therein for passing the item therethrough. The lock comprises a housing having an upper item-entrance slot and a lower item-exit slot at opposite sides of the housing, one of those slots in airtight communication with the opening in the wall. A movable member is disposed within the housing and defines an item-receiving surface which is disposed in a plane making an acute angle with the horizontal. The member is movable between first and second positions in which, respectively, the uppermost portion of the surface is adjacent the lower edge of the entrance slot and the lowermost portion of the surface is below the upper edge of the exit slot. Means are also provided for effecting an air-tight seal between the exit slot and the item-receiving surface when the member is in its first position and between the entrance slot and that surface when the member is in its second position.

Preferably the movable member is a piston having a longitudinal axis and a piston end surface perpendicular to that axis, that end surface providing the item-receiving surface; the piston is tilted at a predetermined acute angle with respect to the vertical whereby the surface is sloped at the same predetermined acute angle with respect to the horizontal; a cavity is provided within the housing for receiving a pressure plate integral with the piston and means are provided for applying force to either side of the pressure plate for moving the piston between the first and second positions and vice versa; those means for applying force comprise a source of high pressure air and means for selectively delivering that air to one or the other side of the pressure plate within the cavity; a flange is provided in the housing which engages the piston in its first position thereby providing a stop to define the first position and also providing the sealing of the exit slot as mentioned above; the means for sealing the entrance slot from the piston surface comprise a second piston constructed and arranged in a substantially identical manner as the first mentioned piston and disposed thereabove with its end surface facing the item-receiving surface of the first piston and parallel thereto; and means are provided for evacuating the volume within the housing between the opposed surfaces of the pistons.

Other objects, features, and advantages of the invention will appear from the following description of a particular preferred embodiment.

DETAILED DESCRIPTION OF A PREFERRED EMBODIMENT

Figure 1:
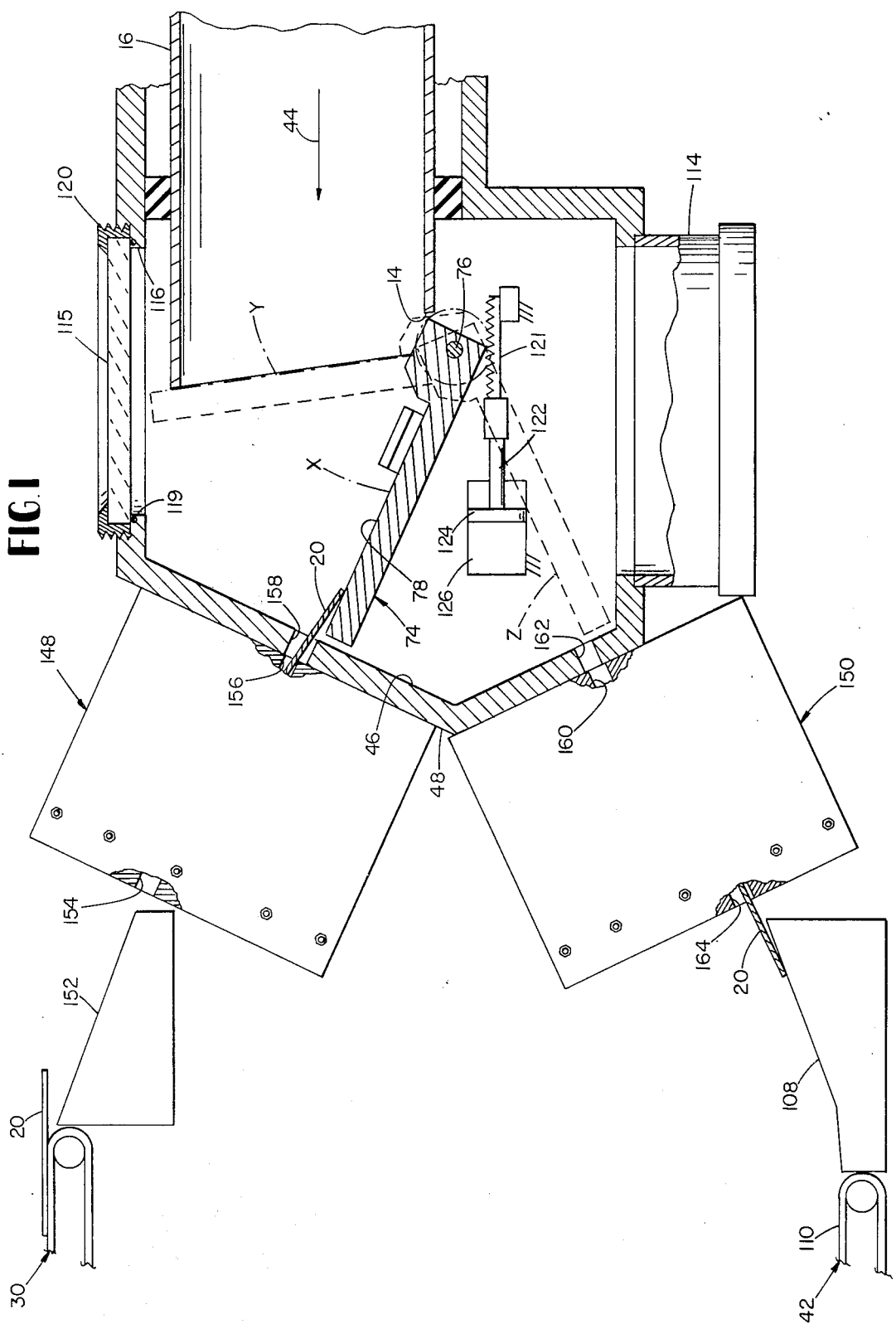
FIG. 1 is a partially broken away side elevation of apparatus for treating wafer-form items in a vacuum including entrance and exit isolation locks constructed in accordance with the present invention.

FIG. 1 illustrates entrance and exit isolation locks 148, 150 employed to pass wafer-form items 20 to and from an ion-implantation apparatus which includes a vacuum chamber 46, defined by a wall or casing 48, within which an ion beam 44 is produced (by means not shown). The beam 44 travels down a tube 16 to the open end 14 thereof which forms a target location.

A wafer positioning means in the form of holder 74 is disposed within the chamber 46 and is mounted for rotation on a shaft 76. The device 74 is in the general form of a receiving tray for accepting a wafer 20 which slides under the influence of gravity from lock 148 through opening 158 in wall 48. A planar surface 78 is the actual surface which receives the wafer and defines the plane of the wafer on the holder 74. The device 74 is rotatable about the axis of shaft 76 so as to be positionable in three separate positions. The first position is indicated by reference line X (see FIG. 1), the second position by reference line Z, and the third position by reference line Y. In the first position the surface 78 is substantially aligned with opening 158. In the third position the surface 78 is generally upright and disposed in the open end 14 of tube 16 within the chamber 46. (As shown in FIG. 1, however, it is often desirable that in this position the wafer be not precisely upright but angled with respect to the vertical at an angle of about 7°. As is well known in the art, such angling is often desirable to prevent a phenomenon as "channeling" which can occur during the implantation of ions in a crystalline lattice.) In the second position, indicated by reference line Z, the surface 78 is angled with respect to the horizontal such that a wafer supported on surface 78 can slide under the influence of gravity through an exit opening 162 in wall 48 to be received in wafer-removal, vacuum lock 150.

The casing 48 also includes an opening which receives a conduit 114 that is ultimately connected to a vacuum pump (not shown). An opening 116 is provided in the upper surface of casing 48 and is aligned with reference line Y (i.e., the position of the wafer to be treated in its treatment orientation). Glass viewing disc 115 overlies the opening 116 and is supported in a threaded retainer 120 forming an airtight seal with resilient seal member 119 which is disposed in a groove which surrounds the opening 116.

The movement of the unit 74 between positions X, Y, and Z is produced by means of a gear which is secured to the shaft 76 exterior of the chamber 46, as indicated schematically in FIG. 1. A rack gear 121 engages the gear and is itself attached to a rod 122 which is attached to a piston 124 in a pneumatic cylinder 126. Air supply and sequencing control (not shown) of conventional design are provided for the cylinder unit 126.

Simple mechanical stops, of course, are sufficient to achieve precisely the desired locations for the unit 74 in the second and third positions (i.e., the positions identified by reference lines Z and Y). For the first position (indicated by reference line X), however a one-way stop is required. Thus, as the unit 74 is swinging from the Y position to the Z position to discharge an implanted wafer, the position at reference line X must simply be by-passed. The timing of the stepwise motion of device 74 is coordinated with the time of the operation of locks 148, 150.

A wafer-form item 20 is delivered by a conveyor 30 to a sloped guide 152 aligned with an entrance aperture 154 of the entry isolation lock 148. The lock as a whole is tilted, and oriented with respect to guide 152, such that the item 20 will slide under the influence of gravity through the slot 154 and into the interior of lock 148. An outlet slot 156 of the lock 148 is aligned with opening 158 in the wall 48.

The exit isolation lock 150 includes an entrance slot 160 aligned with opening 162 in the wall 48, the latter positioned to be aligned with the wafer holder 74 when it resides in the wafer discharge position Z. An outlet slot 164 of the exit isolation lock 50 is aligned with guide or chute 108 which transfers items 20 from the lock 150 to a conveyor 110.

Figure 2:
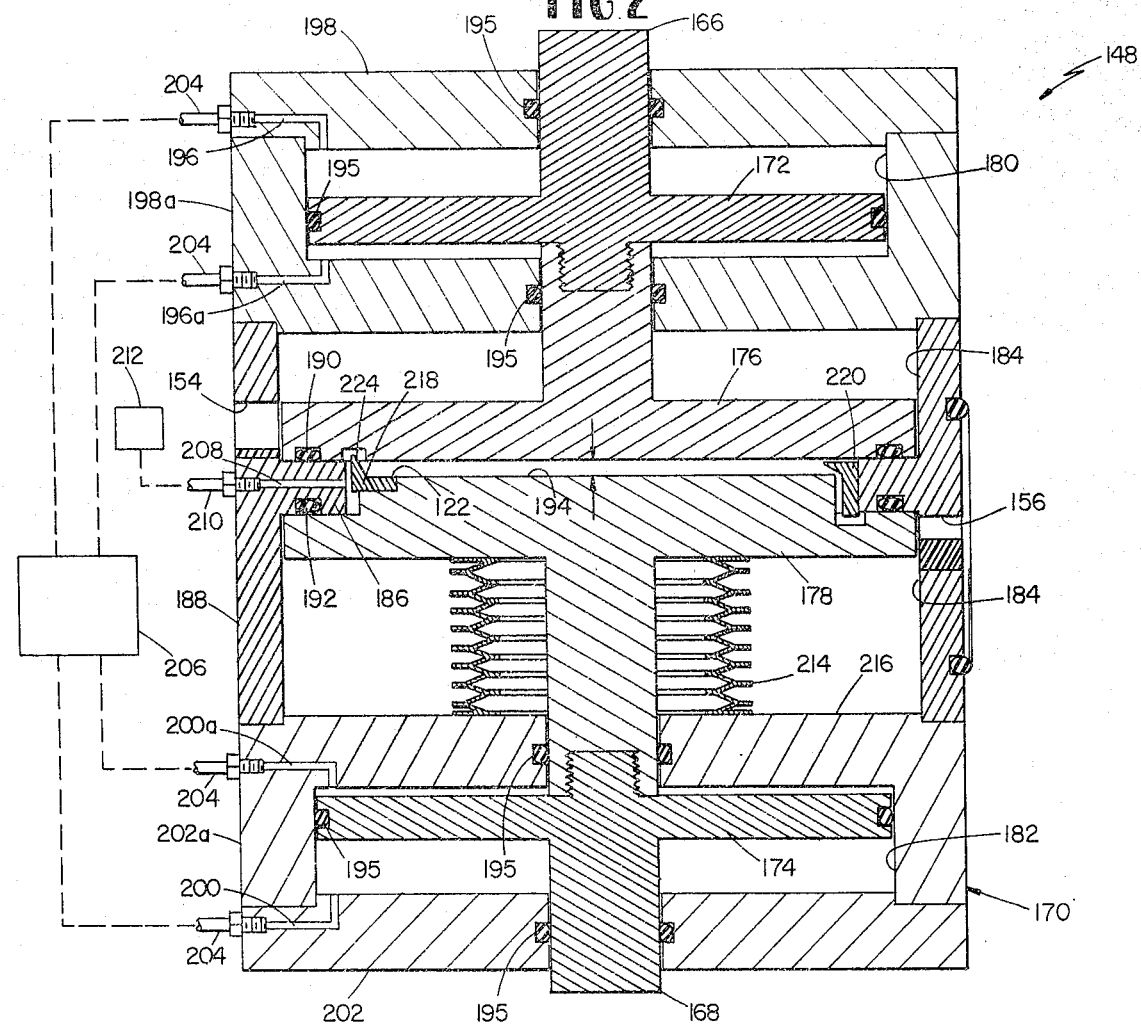
FIG. 2 is a sectional view of the entrance isolation lock of FIG. 1.

FIG. 2 illustrates the internal construction of the lock 148. (The construction of lock 150 would be substantially a mirror-image of the lock 148, as will be apparent to those skilled in the art.)

Figure 3:
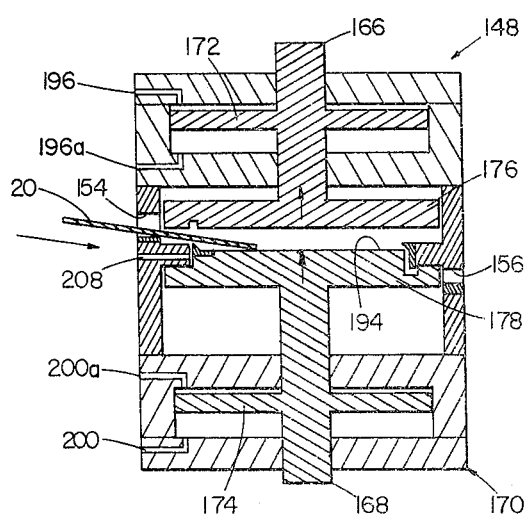
FIGS. 3 and 4 illustrate steps in the operation of the isolation lock of FIG. 2.

As will be seen from FIG. 2, the lock 148 comprises upper and lower pistons 166, 168 mounted within a generally hollow casing 170. Each piston includes an integral pressure plate 172, 174 and a head 176, 178. The casing 170 is formed from a plurality of coaxial parts so as to facilitate manufacture and assembly and provides internal cavities 180, 182 within which pressure plates 172, 174, respectively, are disposed and a larger cavity 184 within which the piston heads 176, 178 are disposed. An annular flange 186 on casing member 188 adjacent cavity 184 provides stop surfaces defining limits of travel of the pistons and, by means of annular sealing members 190, 192, provides for an air tight seal when the respective piston head 176, 178 abuts the flange 186. The upper surface 194 of the lower piston 168 forms a movable item-receiving surface. (It should be recalled that the entire lock 148 of FIG. 3 is supported on the casing 48 of the apparatus in a tilted orientation such that the surface 194 will be sloped with respect to the horizontal.) To separate high vacuum, high pressure, and intermediate pressure portions of the vacuum lock 148, circumferential resilient sealing members 195 are disposed around the periphery of the pressure plate and the piston shaft, both above and below the pressure plate, for each of the pistons 166, 168. Air channels 196, 196a are provided in casing members 198, 198a and communicate with the cavity 180 above and below, respectively, the pressure plate 172. Similarly, air passages 200, 200a are provided in casing members 202, 202a and communicate with cavity 182 below and above respectively, the pressure plate 174. Each of the passages 196, 196a, 200, 200a communicates with an exterior conduit member 204 which in turn is connected to an air pressure supply and control unit 206.

An air passage 208 is also provided in casing member 188 and communicates with the volume of cavity 184 disposed between the piston heads 176, 178. The passage 208 is connected, via conduit member 210, to a vacuum pump 212. An air tight bellows 214 is disposed around the central shaft of piston 168 and is secured at its opposite ends, in an air tight seal, to the piston head 174 and to a flange portion 216 of the casing member 202a. A pair of resilient bumpers 218, 220 are provided adjacent the item-receiving surface 194 at the input slot 154 and output slot 156 sides of the lock respectively. The member 218 is secured to the piston head 178 and has a portion 222 aligned with surface 192 and a portion 224, radially outward therefrom, which projects upwardly from surface 194. The member 220 is secured to the flange portion 186 of the casing member 188. The individual elements forming the casing 170 of the vacuum lock 148 can be secured together in any conventional fashion.

Figure 4:
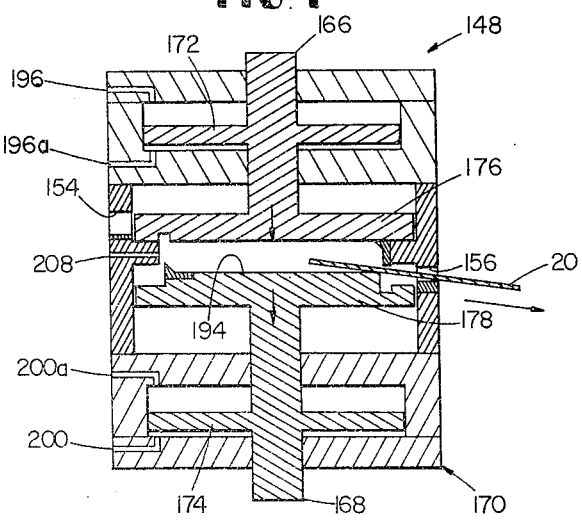

The operation of the vacuum lock 148 may be described with reference to FIGS. 2–4. The air supply and control unit 206 is conventionally constructed to deliver high pressure to the respective air passages 196, 196a, 200, 200a in accordance with a predetermined sequence to operate the pistons 166, 168 in the manner to be described. Since the sequence is continuous and repetitive, the following description will assume an initial "starting point" for the sequence as shown in FIG. 3.

With high pressure air supplied to passages 196a and 200 both pistons will be in their uppermost position and thus the entrance slot 154 will not be blocked by the piston head 176 and the high vacuum in the chamber 46 (which communicates with the exit slot 156) will be protected by the compressional seal effected by the piston head 178 bearing against the resilient seal member 192. In this configuration of the pistons, a wafer-form item 20 is gravitationally delivered to entrance slot 154 and it slides into the lock 148 to rest upon the item-receiving surface 194 of lower piston 168. The resilient member 218 forms a smooth and non-abrasive surface over which the item 20 slides to reach its position of rest on the surface 194 and the member 220 provides a resilient and non-abrasive stop surface which the item 20 will bear against.

With the item 20 disposed on the surface 194, the unit 206 disconnects the high pressure from the passage 196a and connects it to the passage 196, thus forcing the piston 166 downwardly such that seal 190 engages the flange 186. In this orientation of the pistons, the volume within which the item 20 is disposed (the volume of cavity 184 between the piston heads 176, 178) is isolated by the action of seal members 190, 192 and thus becomes evacuated by the action of the continuously operating vacuum pump 212. After this evacuation, the unit 206 interrupts the high pressure connected to passage 200 and connects high pressure to the passage 200a thereby forcing a piston 168 to its lower position, as is illustrated in FIG. 4. In this position, the surface 194 of piston 168 will be positioned relative to the exit slot 156 such as to permit guided sliding motion under the influence of gravity of the item 20 from the surface 194 through the exit slot 156 and on to the surface 78 of holder 74 (see FIG. 1). After the item 20 has left the lock 148, the unit 206 switches the high pressure air from passage 200a back to the passage 200 thereby achieving the lower piston orientation shown in FIG. 3. The unit 206 then transfers the high pressure from air passage 196 to air passage 196a and drives the upper piston 166 to its upper position illustrated in FIG. 3 for a resumption of the cycle just described.

The portion of cavity 184 below piston head 178 will be at high vacuum conditions at all times during the operation cycle of the lock 148. The portion of cavity 182 above the pressure plate 174, on the other hand, will sequentially experience high pressure conditions. With this arrangement, it would be difficult to maintain the required isolation of high pressure from high vacuum solely by means of the sliding seal 195 around the shaft of piston 168 above pressure plate 174. The addition of bellows 214, therefore, provides the required isolation of the high pressure from the high vacuum.

While a particular preferred embodiment of the present invention has been described in detail and illustrated in the accompanying drawings, other embodiments are within the scope of the invention and the following claims.

We claim:

1. An isolation lock through which a workpiece item can move in a path between first and second regions at different pressures, the lock comprising a housing having an upper item entrance and a lower item exit at opposite sides of the housing, a movable member within said housing defining an item-receiving surface disposed substantially in a plane which lies at a constant acute angle to the horizontal regardless of its position to enable gravity movement of said workpiece over said surface, said member movable to translate said item-receiving surface between upper and lower positions in which, respectively, the uppermost portion of said surface is adjacent the entrance to receive said workpiece and the lowermost portion of said surface is adjacent the exit to deliver said workpiece and means providing an air-tight seal between said exit and said surface when said surface is in said upper position and between said entrance and said surface when said surface is in said lower position.

2. The isolation lock of claim 1 wherein said movable member is a piston movable in reciprocating linear motion, said item-receiving surface comprising an end surface of said piston.

3. The isolation lock of claim 2 wherein said piston has a longitudinal axis, said item-receiving surface being disposed substantially perpendicular to said axis, said axis being disposed at a predetermined acute angle with respect to the vertical, whereby said item-receiving surface is disposed at said predetermined acute angle with respect to the horizontal.

4. The isolation lock of claim 3 wherein said housing includes a cavity therein and air-tight seals isolating said cavity from the region of said entrance and exit, said piston including a pressure plate disposed in said cavity in sealing engagement with surfaces of said cavity, said apparatus further comprising means for applying force to opposite sides of said pressure plate for effecting said movement of said item receiving surface between said upper and lower positions.

5. The isolation lock of claim 4 wherein said means for applying force to said pressure plate comprise a source of fluid under pressure and means for selectively delivering said fluid to said cavity on a side of said pressure plate.

6. The isolation lock of claim 5 wherein said fluid is air.

7. The isolation lock of claim 2 wherein said housing includes an internal flange intermediate said entrance and exit, said flange disposed to engage said piston when said piston is in said upper position, a resilient seal member being disposed between said flange and said piston to provide said air-tight seal between said exit and said surface.

8. The isolation lock of claim 7 wherein said means for providing an air-tight seal between said entrance and said surface comprise a second piston disposed above the first mentioned piston and movable between a first position in which said entrance is unblocked and a second position in which said second piston engages said housing flange, a seal member being disposed between said second piston and said flange.

9. The isolation lock of claim 1 wherein a resilient seal member is disposed upon a stationary surface in a position to be engaged and compressed by said movable member when said member moves to said upper position, to form a seal between said item-receiving surface and said exit.

10. An isolation lock through which a workpiece item can move in a path between first and second regions at different pressures, the lock comprising a housing having an upper item entrance and a lower item exit at opposite sides of the housing, a first movable member within said housing defining an item-receiving surface disposed substantially in a plane which lies at a constant acute angle to the horizontal regardless of its position to enable gravity movement of said workpiece over said surface, said member movable to translate said item-receiving surface between upper and lower positions in which, respectively, the uppermost portion of said surface is adjacent the entrance to receive said workpiece and the lowermost portion of said surface is adjacent the exit to deliver said workpiece, said movable member effective to provide an air-tight seal between said exit and said surface when said surface is in said upper position, a second movable member above said first movable member and movable between upper and lower positions, in said lower position said second member effective to provide an airtight seal between said entrance and said surface.

* * * * *